United States Patent [19]

Proebsting

[11] Patent Number: 5,936,905
[45] Date of Patent: Aug. 10, 1999

[54] SELF ADJUSTING DELAY CIRCUIT AND METHOD FOR COMPENSATING SENSE AMPLIFIER CLOCK TIMING

[75] Inventor: Robert J. Proebsting, Los Altos Hill, Calif.

[73] Assignee: Townsend and Townsend and Crew LLP, San Francisco, Calif.

[21] Appl. No.: 08/890,584

[22] Filed: Jul. 9, 1997

Related U.S. Application Data

[60] Provisional application No. 60/025,823, Sep. 3, 1996.

[51] Int. Cl.[6] .................................................. G11C 7/02
[52] U.S. Cl. ............................ 365/208; 365/205; 365/207; 327/52
[58] Field of Search ................................ 365/208, 205, 365/207; 327/51, 52, 55

[56] References Cited

U.S. PATENT DOCUMENTS

| 4,425,633 | 1/1984 | Swain ........................................ 365/194 |
|---|---|---|
| 4,804,871 | 2/1989 | Walter, Jr. .................................. 327/54 |
| 5,132,932 | 7/1992 | Tobita ........................................ 365/222 |
| 5,424,985 | 6/1995 | McClure et al. ......................... 365/194 |
| 5,650,971 | 7/1997 | Longway et al. ........................ 365/207 |
| 5,682,353 | 10/1997 | Eitan et al. .............................. 365/233 |

FOREIGN PATENT DOCUMENTS

| 0 175 880 | 7/1985 | European Pat. Off. . |
|---|---|---|
| 0 644 549 A2 | 9/1994 | European Pat. Off. . |

*Primary Examiner*—David Nelms
*Assistant Examiner*—Hoai V. Ho
*Attorney, Agent, or Firm*—Towsend and Townsend and Crew LLP

[57] ABSTRACT

A circuit technique that optimizes the activation timing of a dynamic sense amplifier includes a circuit that closely tracks process variations to generate the optimum activation signal for the dynamic sense amplifier. In another embodiment, the activation timing for the dynamic sense amplifier is made programmable on a chip-by-chip basis to not only arrive at the optimal timing for the activation signal, but to also enable the manufacturer to guarantee a certain amount of margin in the operation of the circuit.

28 Claims, 3 Drawing Sheets

SELF ADJUSTING DELAY CIRCUIT AND METHOD FOR COMPENSATING SENSE AMPLIFIER CLOCK TIMING

This application claims benefit of provisional application Ser. No. 60/025,823 filed Sep. 3, 1996.

BACKGROUND OF THE INVENTION

The present invention relates in general to integrated circuits, and in particular to a timing circuit for a dynamic sense amplifier for memory circuits.

When reading the content of a memory circuit, sense amplifiers are used to sense and amplify the signal stored in a memory cell. There are basically two types of sense amplifiers, dynamic and static. FIG. 1 shows a typical static sense amplifier and FIG. 2 is an example of a dynamic sense amplifier circuit. The cross-coupled inverters 202/204 and 206/208 of the dynamic sense amplifier operate as a latch with positive feedback. Because of the positive feedback, the dynamic sense amplifier is inherently much faster than a static sense amplifier. A dynamic sense amplifier also consumes much less power since it switches to zero power as soon as it has made a decision as compared to the static sense amplifier which continues to dissipate power indefinitely.

Furthermore, a dynamic sense amplifier is much better suited for certain types of circuits, such as synchronous memory circuits, where speed enhancing techniques such as post charge logic (described in U.S. Pat. No. 4,985,643) or skewed logic (described in U.S. Pat. No. 5,519,344) can be used. This is due to the fact that the output of a dynamic sense amplifier is a pulse whose propagation speed can be made faster using these techniques as compared to the level output of a static sense amplifier in a conventional circuit.

It is therefore desirable to use dynamic sense amplifiers for power and speed advantages. However, a major drawback of a strobed dynamic sense amplifier, an example of which is shown in FIG. 2, is that its operation is highly sensitive to the timing of the strobe signal. When a positive pulse arrives on the STRB input, the sense amplifier makes a decision based on the differential voltage on its inputs relative to any offset voltage the amplifier may have, and the decision is irreversibly latched. In the context of a memory circuit, for example, if strobed too early (i.e., before a large enough differential signal at its inputs has developed), the sense amplifier may latch wrong data. On the other hand, if strobed too late (i.e., after developing a larger signal), time is unnecessarily wasted, adding to valuable access time. The optimum timing for the strobe signal would require an aggressively early strobe, yet not so aggressive that the sense amplifier fails to operate properly.

In a memory circuit, there are a number of different factors that impact the timing of the strobe signal for a dynamic sense amplifier. The inputs of the sense amplifier connect to a complementary pair of bit lines whose capacitance directly affect the speed of operation. If, for example, on a particular die there is more capacitance on the bit lines than the average expected bit line capacitance, the signal will develop slower. The sense amplifier must therefore wait longer (i.e., delayed strobe). Conversely, for a die exhibiting lower bit line capacitance than average, the sense amplifier can be strobed earlier.

Variations in the size of a memory cell access transistor also directly impact the speed of operation for the dynamic sense amplifier. Because a memory cell access transistor is typically very narrow (e.g., a fraction of a micron), even the smallest variations in the size may significantly impact the speed of the circuit. In case of, for example, a particularly wide access transistor, there will be higher current which develops a signal on the bit lines faster. A narrower access transistor, on the other hand, develops a signal slower.

Another factor that directly affects the timing requirements of the dynamic sense amplifier is resistivity of a word line made of poly silicon. The poly silicon may be particularly high in resistance or particularly low in resistance from one die to another. If the poly silicon has high resistance, it takes a longer time for the signal on that word line to get to the memory cell to start developing a signal. If it exhibits lower resistance, the signal will develop more quickly.

To ensure proper operation of the sense amplifier under all process conditions, designers have been typically quite conservative in the amount of time by which the sense amplifier strobe signal is delayed after signal starts to develop. This of course results in slower access time for the memory circuit. An overly aggressive design, on the other hand, may result in faster memory circuits but would also significantly increase the number of malfunctioning parts.

There is therefore a need for techniques that optimize the timing performance of dynamic sense amplifiers in memory circuits.

SUMMARY OF THE INVENTION

The present invention provides methods and circuits for optimizing the timing performance of dynamic sense amplifiers. In one embodiment, this invention provides a circuit that will closely track the process variations to generate the optimum activation signal for the sense amplifier. In another embodiment, the present invention provides a circuit that on a chip-by-chip basis can be programmed to arrive at the optimal timing for the operation of the dynamic sense amplifier.

Accordingly, the present invention provides in one embodiment, a circuit comprising a sense amplifier having first and second differential inputs, a strobe input and an output, the first and second differential inputs being respectively coupled to bit and bit bar lines, a plurality of storage cells coupled to the bit and bit bar lines via a respective first plurality of access transistors, and a word line coupled to a second plurality of access transistors. The circuit further comprises a dummy word line coupled to a plurality of dummy access transistors replicating one word line and the second plurality of access transistors, a selected group of the dummy access transistors being coupled to a dummy bit line, and a strobe driver circuit having an input coupled to the dummy bit line and an output coupled to the strobe input of the sense amplifier. Thus, the circuit that generates the strobe signal is designed such that it tracks process variations that impact the speed of operation. This ensures that the sense amplifier is strobed with optimum timing regardless of the process variations from part to part.

In another embodiment, the circuit further includes programmable switches that programmably couple selected ones of the selected group of the dummy access transistors to the dummy bit line. The timing of the strobe signal can thus be adjusted for each circuit by programming the number of dummy access transistors that couple to the dummy word line.

A better understanding of the nature and advantages of the present invention may be had with reference to the detailed description and the drawings below.

DESCRIPTION OF THE PREFERRED EMBODIMENT

Figure 1:
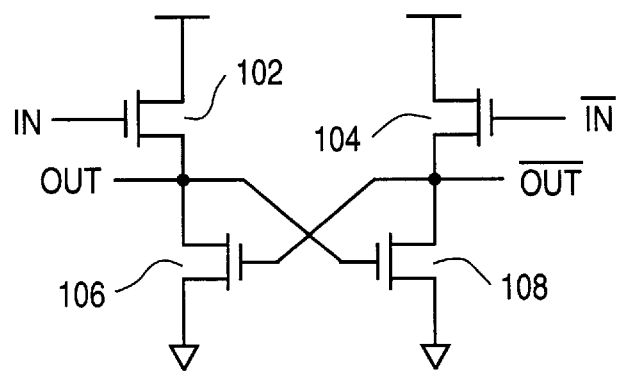
FIG. 1 shows a typical static sense amplifier.
Figure 2:
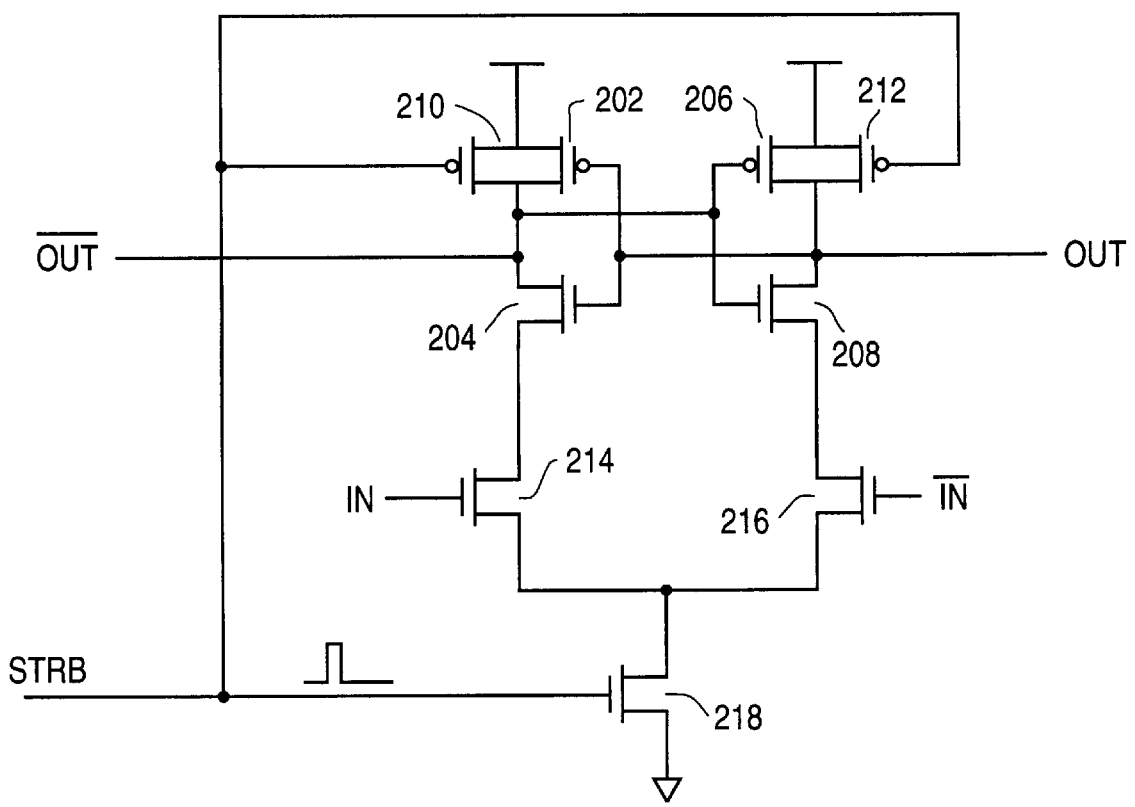
FIG. 2 is a circuit diagram of an exemplary dynamic sense amplifier.
Figure 3:
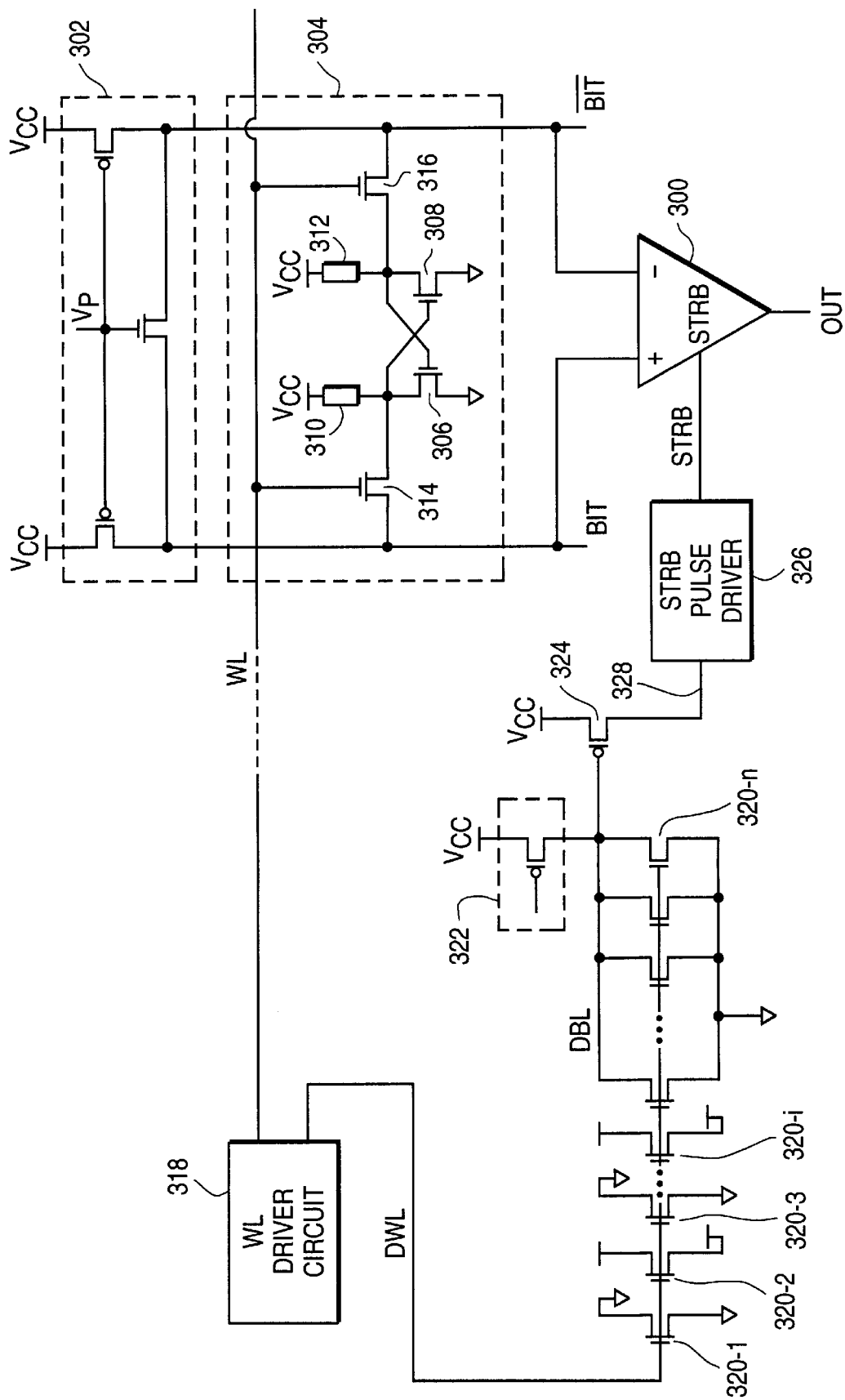
FIG. 3 is a simplified circuit diagram illustrating the sense amplifier strobe signal generating circuit according to one embodiment of the present invention.

Referring to FIG. 3, there is shown a dynamic sense amplifier 300 used in a static random access memory (SRAM). It is to be understood that the principles of the present invention are applicable in other types of memory circuits including dynamic random access memories. The differential inputs of sense amplifier 300 respectively connect to BIT and BIT bar lines that are precharged to Vcc using precharge circuit 302. A typical SRAM cell 304 connects to BIT and BIT bar. SRAM cell 304 includes a storage latch made up of transistors 306 and 308 and load devices 310 and 312, and access transistors 314 and 316. Gate electrodes of memory cell access transistors 314 and 316 connect to a word line WL. Word line WL is driven by a WL driver circuit 318 which is typically made up of a NAND gate followed by several inverters.

In operation, when word line WL is selected (i.e., carrying logic high), access transistors 314 and 316 are turned on connecting BIT and BIT bar to the latch inside memory cell 304. Having been previously precharged to Vcc, depending on the content of the latch, the voltage on either BIT or BIT bar starts to drop toward ground as current is drawn by the corresponding latch transistor (306 or 308). A differential voltage $\Delta V$ thus starts to develop across BIT and BIT bar. Once $\Delta V$ reaches a level detectable by sense amplifier 300, strobe signal STRB is applied to activate the sensing operation. The desired timing of STRB is thus determined by the time it takes for minimum $\Delta V$ to develop from the time WL is asserted. The designer typically calculates the minimum $\Delta V$ that is required by the sense amplifier and then arrives at a time value for STRB activation based on the parasitic R/C load of WL, the size of the access transistor, and the capacitance on BIT (or BIT bar) line.

To minimize access time, it is desirable to wait only long enough for the minimum $\Delta V$ required by sense amplifier 300 and not any longer before STRB is generated. As discussed above, variations in resistivity of the poly silicon WL, capacitive load on BIT and BIT bar lines, and the size of access transistors 314 and 316 directly affect the speed at which the differential voltage on BIT and BIT bar lines develops. Thus, due to process variations, the minimum delay for STRB varies from die to die. The prior art generates STRB by typically delaying WL by a number of inverters, enough to allow $\Delta V$ to develop plus some margin for process variations. The result is a poor compromise that yields neither the fastest access time (i.e., wastes unnecessary time), nor the highest yield over process variations.

The present invention instead provides a circuit technique whereby the circuit that generates STRB tracks process variations such that optimum STRB timing is maintained on each die. Referring to FIG. 3, a dummy word line DWL made of poly silicon (or any other combination of conductive materials) replicating word line WL is driven by WL driver circuit 318. Dummy word line DWL drives dummy access transistors 320-1 to 320-n, where n is the exact same number as the number of access transistors (314/316) connected to word line WL. In order to accurately match the capacitive loading on DWL with that of WL, both source and drain terminals of dummy access transistors 320 preferably alternately connect to Vcc and ground as shown. Except, a select group of dummy transistors 320 have their drain terminals connected together and to a dummy bit line DBL, and their source terminals connected to ground. A dummy precharge circuit 322 precharges DBL to Vcc. DBL also connects to a gate terminal of transistor 324 whose drain terminal connects to a strobe pulse driver circuit 326. The output of strobe pulse driver 326 supplies the signal STRB to the STRB input of sense amplifier 300.

This circuit replicates those memory circuit elements that affect the time it takes for the bit line $\Delta V$ to develop, in order to maintain optimum STRB timing over significant changes in process parameters. Thus, DWL exhibits the same resistance and same capacitive loading as WL. Similarly, DBL connecting to dummy access transistors 320 has the same capacitive loading (including transistor 324) as BIT or BIT bar lines, and dummy access transistors 320 are identical in size and layout to access transistors 314/316 and therefore undergo the exact same changes over process variations.

The number of dummy access transistors 320 that are connected in parallel and to DBL can be selected by the designer. In an embodiment where each WL connects to, for example, 32 memory cells (i.e., 64 access transistors), one can connect, for example, one quarter of the load, that is 16 dummy transistors 320, in parallel. Thus, when WL and DWL are both asserted, given identical loading and access transistor sizes, DBL is pulled down toward ground with 16 times as much current as BIT (or BIT bar). This can be any known ratio. For example, instead of being identical in size, the circuit can be designed such that the load capacitance on DBL is twice that of BIT (or BIT bar), or the number of parallel-connected dummy transistors may be changed.

In operation, when WL is asserted, precharge circuitry 302 turns off, access transistors 314 and 316 turn on and $\Delta V$ starts to develop across BIT and BIT bar. Dummy word line DWL is also asserted turning parallel-connected dummy access transistors 320 on. Thus, as $\Delta V$ starts to develop, the voltage on DBL is pulled down toward ground. Assuming memory cell 304 is storing a logic zero (i.e., ground) and the load capacitance on DBL is twice that of BIT (i.e., $C_{DBL} = 2C_{BIT}$) and there are 16 parallel-connected dummy transistors 320, the voltage on DBL moves toward ground 8 times as fast as the voltage on BIT. To simplify the numbers, further assume that the threshold voltage Vt of transistor 324 is about (−800 mV) and the minimum required $\Delta V$ for sense amplifier 300 is 100 mV. Accordingly, as the voltage on DBL reaches 800 mV below Vcc, the voltage on BIT would have moved by ⅛ or 100 mV, the required $\Delta V$. At this time, transistor 324 is turned on pulling node 328 toward Vcc. STRB pulse driver 326, which includes, for example, several buffering inverters, supplies the STRB pulse in response to the signal on node 328. The delay introduced by STRB pulse driver 326 can be accounted for earlier in the logic path in, for example, word line driver circuit 318. That is, if STRB pulse driver 326 introduces an additional, for example, four gate delays, WL driver circuit 318 can assert DWL four gate delays earlier than the regular word line WL. As a result, the timing of STRB (activation of sense amplifier 300) is always in direct response to and tracks the timing of $\Delta V$.

The tracking between the sense amplifier $\Delta V$ and the STRB signal takes into account variations in polysilicon resistance across WL which is replicated by DWL. Thus, if on a particular die, polysilicon resistance is higher (i.e., longer delay on WL) such that it takes longer for $\Delta V$ to develop, the polysilicon DWL similarly slows down STRB. Also, if access transistors 314/316 are particularly strong on a given die and drive BIT lines with more current, dummy access transistors 320 would be similarly strong and generate STRB correspondingly faster. Therefore, the processing related factors that make ΔV develop faster or slower also make STRB faster or slower in a identical fashion. The circuit of the present invention thus ensures optimum timing for the activation signal of the dynamic sense amplifier.

Figure 4:
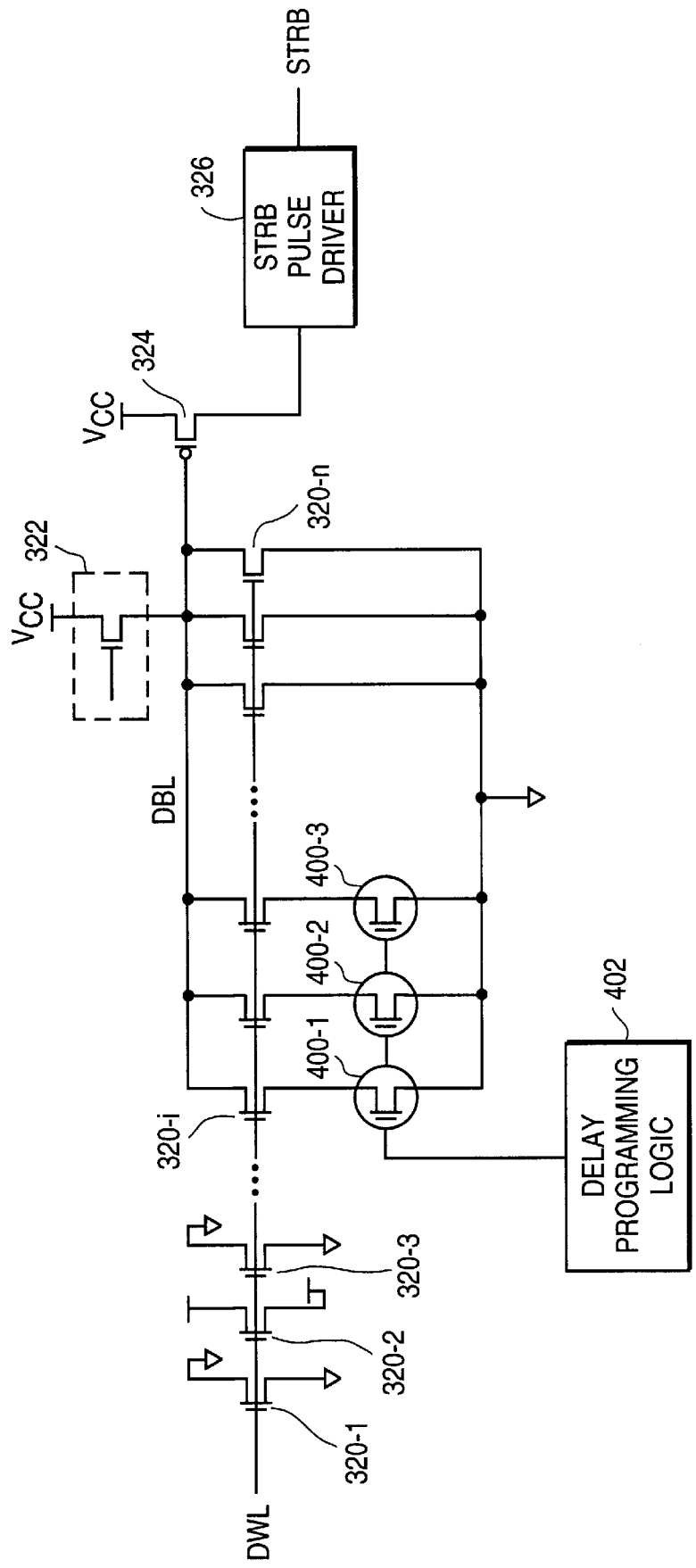
FIG. 4 shows a second programmable embodiment of the sense amplifier circuit of the present invention.

In a second embodiment of the present invention, the number of parallel-connected dummy transistors 320 is made programmable. This provides further control over the fine tuning of the timing of STRB. Referring to FIG. 4, there is shown the dummy circuitry including DWL replicating the regular WL and dummy access transistors 320-1 to 320-n replicating regular access transistors. In this embodiment, as in the embodiment shown in FIG. 3, a selected number of dummy access transistors 320 are connected in parallel. However, in the embodiment shown in FIG. 4, for a selected group of the parallel-connected dummy access transistors 320 a programmable switch or transistor 400 is inserted between their source terminal and ground. Programmable switches 400 are programmed by a delay programming logic block 402. When a transistor 400 is programmed into a conducting state, its corresponding dummy transistor 320, when turned on, would contribute to the current pulling down DBL. Thus, the more programmable transistors 400 are turned on, the faster is STRB generated, and vice versa.

While the embodiment in FIG. 4 shows some transistors 320 having a programmable switch and some that connect directly to ground, any number, including all, of the parallel-connected transistors 320 can be made programmable. For illustrative purposes, assume there are 20 parallel-connected transistors 320, 10 of which are programmable using a relatively large sized transistor 400-i as the programmable switch. The circuit may be preprogrammed to have, for example, 6 programmable transistors 400 turned on for a default 16 parallel-connected transistors 320 that when turned on connect DBL to ground. During testing of each die by the manufacturer, this circuit can be programmed to have a larger number of programmable dummy transistors 320 turned on to test for faster operation. For example, four additional programmable transistors 400 can be logically programmed into a conductive state. The circuit is then tested to check for the operation of the sense amplifier with 20 dummy transistors 320 pulling DBL down. If this faster STRB produces correct results, more dummy transistors 320 can be connected in parallel by programming transistors 400. This programming and testing process is repeated until the fastest possible timing for STRB is determined. If the operation of the circuit is tested to be functional with, for example, 19 conductive dummy transistors 320, and to fail with 20, the circuit can be finally programmed for a total of 18 transistors to provide for a built-in margin.

This embodiment of the present invention thus not only provides a mechanism to fine tune the timing of STRB, it also allows the designer to guarantee that there is some margin in the operation of the circuit. For example, the contribution of each dummy transistor 320 may speed up STRB by, for example, 0.1 nsec. Thus, during testing a die may be found marginally operational at 0.8 nsec, but would have solid performance at 0.9 nsec. The programming of this circuit can be performed either through logic inputs available during test, by laser-programmed fuses, or other well known programming techniques. Once the desired number of transistors 320 is determined, the part can be permanently laser programmed for the optimum timing. As an additional feature, the circuit can make provisions for accepting illegal commands that typically exist in many types of memory circuits such as static random access memories. Thus, on a finished product at final test, the circuit can change to, for example, one speed grade faster or slower in response to a specific illegal command. That is, if a product is being shipped with, for example, 18 parallel-connected conductive dummy transistors 320, it can be programmed for 19 transistors and then tested. This allows the manufacturer to guarantee the operation of the circuit with 18 transistors even if sensing occurs slightly earlier. This provides some guaranteed margin even at final test.

While a specific embodiment of this invention has been described in connection with an SRAM, the principle teachings of this invention and the advantages thereof also apply to other types of memory circuits such as dynamic random access memories (DRAMs). As is known to those skilled in this art, in a DRAM, asserting a column decode line selectively turns on column decode transistors (corresponding to access transistors in an SRAM, and generally referred to herein as pass transistors), causing a ΔV to develop between complementary input/output (I/O) lines. Drawing the parallel between the two types of memory circuits, in essence, DRAM bit line sense amplifiers correspond to SRAM memory cells (generally referred to herein as latches), DRAM column decode lines correspond to SRAM word lines (generally referred to herein as control lines), and DRAM I/O lines correspond to SRAM bit lines (generally referred to herein as data lines). Thus, the DRAM presents the same problem of sense amplifier timing as does the SRAM. Accordingly, a similar technique to that taught by the present invention can be employed to optimize the timing of the DRAM sense amplifier operation.

In conclusion, the present invention provides circuit techniques for optimizing the operational timing of dynamic sense amplifiers. In one embodiment, a circuit that closely tracks process variations is provided to generate the optimum activation signal for the dynamic sense amplifier. In another embodiment, the activation timing for the dynamic sense amplifier is made programmable on a chip-by-chip basis to not only arrive at the optimal timing for the activation signal, but to also enable the manufacturer to guarantee a certain amount of margin in the operation of the circuit. While the above is a complete description of specific embodiments of the present invention, various modifications, variations and alternatives may be employed. For example, the preferred embodiment shown in FIG. 3 addresses variations in word line (generally control line) resistance, bit line (generally data line) capacitance and current drive of access (generally pass) transistors, all in one circuit. One of skill in this art would appreciate that similar but slightly modified circuitry can be used to address any one of the above factors individually or in any combination. The scope of this invention, therefore, should not be limited to the embodiments described, and should instead be defined by the following claims.

What is claimed is:

1. A circuit comprising:
   a sense amplifier having first and second differential inputs, a strobe input and an output, the first and second differential inputs being respectively coupled to data and data bar lines;
   a plurality of latches coupled to the data and data bar lines via a respective plurality of pass transistors;
   a control line coupled to the plurality of pass transistors;
   a strobe signal generating circuit having an output coupled to the strobe input of the sense amplifier, the strobe signal generating circuit generating a strobe signal at its output;

wherein the strobe signal generating circuit includes:
a dummy control line;
a plurality of inactive dummy pass transistors coupled to the dummy control line; and
a plurality of active dummy pass transistors coupled to the dummy control line.

2. The circuit of claim 1 wherein the dummy control line has physical characteristics substantially replicating the control line.

3. The circuit of claim 2 wherein the strobe signal generating circuit further comprises a dummy data line coupled to a selected plurality of the dummy pass transistors, the dummy data line substantially replicating the data line.

4. The circuit of claim 3 wherein the dummy control line couples to a gate terminal of the plurality of the active dummy pass transistors, and wherein a selected group of the plurality of active dummy pass transistors each have a first terminal coupled to the dummy data line and a second terminal coupled to ground.

5. The circuit of claim 4 wherein the delay of the strobe signal increases as the resistance of the control line increases, when the current drive of the plurality of pass transistors decreases, or when the capacitance of the data line increases.

6. The circuit of claim 4 wherein the strobe signal generating circuit further comprises user programmable elements to allow a user to change the delay of the strobe signal.

7. The circuit of claim 6 wherein the user programmable elements comprise a plurality of programmable pass transistors respectively inserted between a selected number of the selected group of the plurality of active dummy pass transistors and ground.

8. The circuit of claim 4 further comprising a control line driver circuit having a first output coupled to control line and a second output coupled to the dummy control line.

9. The circuit of claim 8 further comprising a first precharge circuit coupled to the data and data bar lines and a second precharge circuit coupled to the dummy data line.

10. The circuit of claim 9 wherein the strobe signal generating circuit further comprises a driver circuit comprising:
a driver transistor having a gate terminal coupled to the dummy data line; and
a pulse driver circuit having an input coupled to a source/drain terminal of the driver transistor, and an output coupled to the strobe input of the sense amplifier.

11. The circuit of claim 1 wherein the strobe signal generating circuit further comprises user programmable elements to allow a user to change the delay of the strobe signal.

12. The circuit of claim 1 wherein the strobe generating circuit comprises a word line driver circuit having an output coupled to the control line and the dummy control line, wherein the word line driver circuit asserts an output on the dummy control line before asserting an output on the control line.

13. The circuit of claim 1, wherein the plurality of inactive dummy pass transistors are alternatingly biased at substantially ground and $V_{DD}$ potentials.

14. A circuit comprising:
a sense amplifier having first and second differential inputs, a strobe input and an output, the first and second differential inputs being respectively coupled to data and data bar lines;
a plurality of latches coupled to the data and data bar lines via a respective plurality of pass transistors;
a control line coupled to the plurality of pass transistors;
a strobe signal generating circuit having an output coupled to the strobe input of the sense amplifier;
wherein the strobe signal generating circuit includes:
a dummy control line; and
a plurality of dummy pass transistors coupled to the dummy control line, the plurality of dummy pass transistors substantially replicating the plurality of pass transistors coupled to the control line.

15. The circuit of claim 14 wherein the dummy control line has physical characteristics substantially replicating the control line.

16. The circuit of claim 15 wherein the strobe signal generating circuit further comprise a dummy data line coupled to a selected plurality of the dummy pass transistors, the dummy data line substantially replicating the data line.

17. The circuit of claim 14 wherein the strobe signal generating circuit further comprises user programmable elements to allow a user to change the delay of the strobe signal.

18. The circuit of claim 14 wherein the strobe generating circuit comprises a word line driver circuit having an output coupled to the control line and the dummy control line, wherein the word line driver circuit asserts an output on the dummy control line before asserting an output on the control line.

19. The circuit of claim 14, wherein the plurality of dummy pass transistors includes a first plurality of dummy pass transistors which are alternatingly biased at substantially ground and $V_{DD}$ potentials.

20. A circuit comprising:
a dynamic sense amplifier having differential inputs, a strobe input, and an output, the dynamic sense amplifier being activated by a strobe signal received on the strobe input;
a strobe signal generating circuit having an output coupled to the strobe input of the dynamic sense amplifier, and an input, the strobe signal generating circuit having a programmable element coupled to the input; and
a timing control logic having an output coupled to the programmable element;
wherein, the timing control logic changes the timing of the strobe signal by programming the programmable element in the strobe signal generating circuit.

21. The circuit of claim 20 wherein the strobe signal generating circuit comprises a plurality outputs and a plurality of programmable elements, and wherein the timing control logic comprises a plurality of outputs.

22. The circuit of claim 20 further comprising:
a differential signal generating circuit having a data path with outputs coupling to the differential inputs of the dynamic sense amplifier, the differential signal generating circuit generating a differential signal whose timing varies with variations in the physical characteristics of the data path, and
wherein, the strobe signal generating circuit varies the timing of the strobe signal in response to the variations in the timing of the differential signal.

23. In a memory device having a data line coupled to a sense amplifier and to a memory cell via pass transistors, a control line coupled to the data line via a plurality of pass transistors, and a strobe generating circuit coupled to a strobe input of the sense amplifier, a method for strobing a sense amplifier substantially synchronous with the generation of a sense amplifier input voltage, the method comprising the steps of:

provic ing a dummy data line coupled to the sense amplifier strobe input;

providing a dummy control line coupled to the dummy data line; and asserting a signal on the dummy control line prior to asserting a signal on the control line.

24. The method of claim 23 wherein the step of providing the dummy control line comprises the steps of:

providing a plurality of inactive dummy pass transistors coupled to the dummy control line; and providing a plurality of active dummy pass transistors coupled to the dummy control line.

25. The method of claim 24 wherein the step of providing the plurality of inactive dummy pass transistors further comprises the step of alternatingly biasing the plurality of inactive dummy pass transistors between substantially ground and $V_{DD}$ potentials.

26. The method of claim 24 wherein the of step of providing the plurality of inactive dummy pass transistors comprises the step of providing a first plurality of dummy pass transistors coupled to the dummy control line, the first plurality of dummy pass transistors substantially replicating the plurality of pass transistors coupled along the control line.

27. The method of claim 26 wherein the step of providing the plurality of active dummy pass transistors comprises the step of parallel-coupling a predetermined number of the plurality of active dummy pass transistors, wherein when a high signal reaches the predetermined number of parallel coupled transistors, the predetermined number of transistors conduct current.

28. The method of claim 27 wherein the step of providing the plurality of active dummy pass transistors further comprises of the step of providing a programmable switch in series with each of the predetermined number of transistors, wherein, each programmable switch, when activated, allows the predetermined transistor to conduct.

* * * * *